US006434735B1

(12) United States Patent
Watkins

(10) Patent No.: US 6,434,735 B1
(45) Date of Patent: Aug. 13, 2002

(54) METHOD FOR PROGRAMMING AN FPGA AND IMPLEMENTING AN FPGA INTERCONNECT

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/464,741

(22) Filed: Dec. 16, 1999

(51) Int. Cl.[7] ................................................ G06F 17/50
(52) U.S. Cl. ........................................................ 716/16
(58) Field of Search ................... 716/56, 1–21

(56) References Cited

U.S. PATENT DOCUMENTS 5,960,191 A * 9/1999 Sample ........................ 703/28

* cited by examiner

*Primary Examiner*—Nathan J. Flynn
*Assistant Examiner*—Thuan Do
(74) *Attorney, Agent, or Firm*—Christopher P. Maiorana, PC

(57) ABSTRACT

An apparatus comprising a plurality of register logic circuits, a core circuit, a memory circuit, and a plurality of logic circuits. The register logic circuits may each be configured to generate a first logic signal in response to (i) an input data signal, (ii) a second logic signal, (iii) a first clock signal and (iv) a second clock signal. The core circuit may be configured to generate a plurality of data signals and a first control signal in response to the first logic signals and a second control signal. The memory may be configured to present the second control signal to the core circuit. The logic circuits may each be configured to present the second logic signal in response to the first logic signal and the data signals. An embedded FPGA core may be enabled to provide an interconnect to a chip. Additionally, software may enable a wide variety of features including bug fixes and product variations, all without changing the silicon.

26 Claims, 5 Drawing Sheets

US 6,434,735 B1

METHOD FOR PROGRAMMING AN FPGA AND IMPLEMENTING AN FPGA INTERCONNECT

FIELD OF THE INVENTION

The present invention relates to a field programmable gate array (FPGA) core interconnect method and/or architecture generally and, more particularly, to an FPGA core interconnect that may enable bug fixes, in-field upgrades, and/or product variations using a common system on a chip (SOC).

BACKGROUND OF THE INVENTION

One conventional approach for implementing an FPGA core interconnect is to implement an external FPGA chip on the same board as a system on a chip (SOC). Alternately, the FPGA core input/output (I/O) is connected to an I/O of the chip. Another approach is to implement an FPGA core attached to a bus.

The first two conventional methods are limited by speed and size of the I/O of the chip for access to signals to be used in FPGA functions. An FPGA core I/O can be connected to the chip I/O, so that all the FPGA I/Os can have access to all functional chip I/Os. Such an approach has limited usefulness, since the package implements only a few hundred I/O pins. Since there can be hundreds of thousands of gates on the chip, many of the gates would not be accessible with such an approach.

The FPGA core can be attached to an internal bus of the chip. The chip can access the core as if it were part of memory or register address space. Such an approach can provide fast processing of limited functions that can be programmed in the FPGA as the values need to be loaded up, processed, and unloaded. An additional process needs to be implemented to gather the correct signal point values to present to the FPGA process and write back the FPGA processed points. Therefore, it would be desirable to integrate an FPGA core with interconnect architecture on the same chip as another device (e.g., a system on a chip) to improve the utility of the FPGA core.

SUMMARY OF THE INVENTION

One aspect of the present invention concerns an apparatus comprising a plurality of register logic circuits, a core circuit, a memory, and a plurality of logic circuits. The register logic circuits may each be configured to generate a first logic signal in response to (i) an input data signal, (ii) a second logic signal, (iii) a first clock signal and (iv) a second clock signal. The core circuit may be configured to generate a plurality of data signals and a first control signal in response to the first logic signals and a second control signal. The memory may be configured to present the second control signal to the core circuit. The logic circuits may each be configured to present the second logic signal in response to the first logic signal and the data signals.

Another aspect of the present invention concerns a method for programming a field programmable gate array (FPGA) comprising the steps of turning a system clock off, turning a scan clock on, forward shifting through a plurality of taps to a selected tap and serially programming one or more first registers from the selected tap.

The objects, features and advantages of the present invention include providing a method and/or architecture that may (i) add value above simple integration of an FPGA core versus an off-chip FPGA implementation, (ii) allow accessibility to internal signal points, (iii) enable one or more sections of a chip to be accessible to the FPGA core, (iv) allow a scan to minimize the hardware needed to implement an FPGA interconnect, (v) allow a backward scan shift function, (vi) allow a multiplexor to select a data feed from the FPGA, (vii) allow internal FPGA functions to control registers, (viii) implement multiplexors to minimize the hardware needed to implement the FPGA interconnect, (ix) design scales to FPGA size, SOC size and FPGA interconnect fragmentation needs, (x) allow the scan to scan other SOC chips for useful FPGA core inputs, and/or (xi) allow a multiplexor to scan taps, essentially creating a significant amount of inputs for the FPGA functions for a very low hardware cost.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
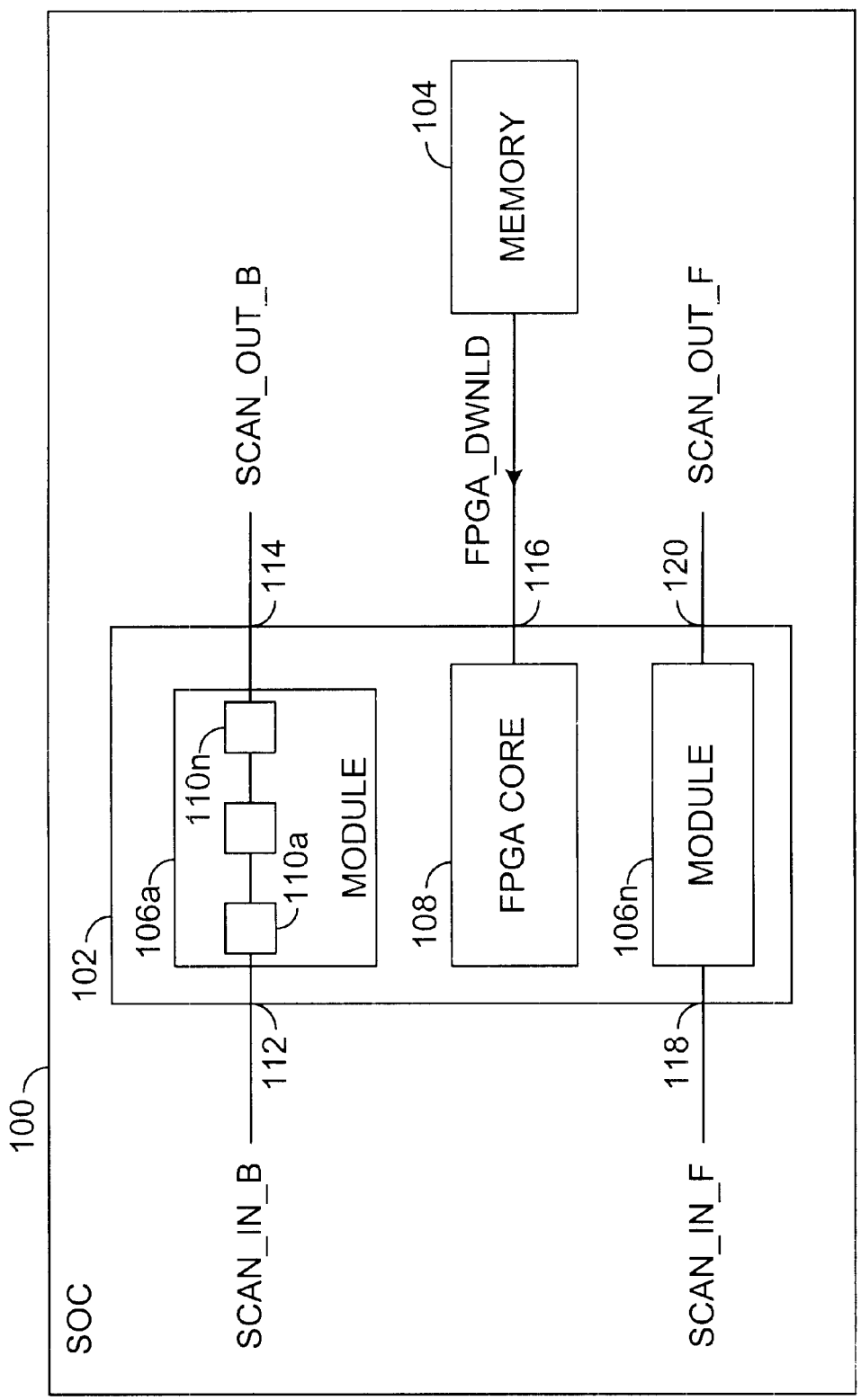
FIG. 1 is a block diagram of an embedded FPGA core.

Referring to FIG. 1, a block diagram of a circuit 100 illustrating an embedded FPGA core is shown. The circuit 100 may be implemented, in one example, as a system on a chip (e.g., SOC). The circuit 100 generally comprises a circuit 102 and a memory 104. The circuit 102 may be implemented, in one example, as a field programmable gate array (e.g., FPGA). The FPGA 102 generally comprises a plurality of circuits 106a–106n and a core circuit 108. Each of the circuits 106a–106n may comprise one or more registers 110a–110n. The core circuit 108 may be implemented, in one example, as a FPGA core interconnect. A scalable architecture for an FPGA core interconnect may be implemented with (i) a small FPGA core, (ii) a large FPGA core, (iii) a plurality of multiple independent cores and/or (iv) one or more clustered cores, independent of the size of the SOC. The circuit 102 may have an input 112 that may receive a signal (e.g., SCAN_IN_B). The circuit 102 may have an output 114 that may generate a signal (e.g., SCAN_OUT_B) in response to the signal SCAN_IN_B. The core portion 108 may have an input 116 that may receive a signal (e.g., FPGA_DWNLD) from the memory 104. The circuit 102 may have an input 118 that may receive a signal (e.g., SCAN_IN_F). The circuit 102 may have an output 120 that may generate a signal (e.g., SCAN_OUT_F) in response to the signal SCAN_IN_F.

Figure 2:
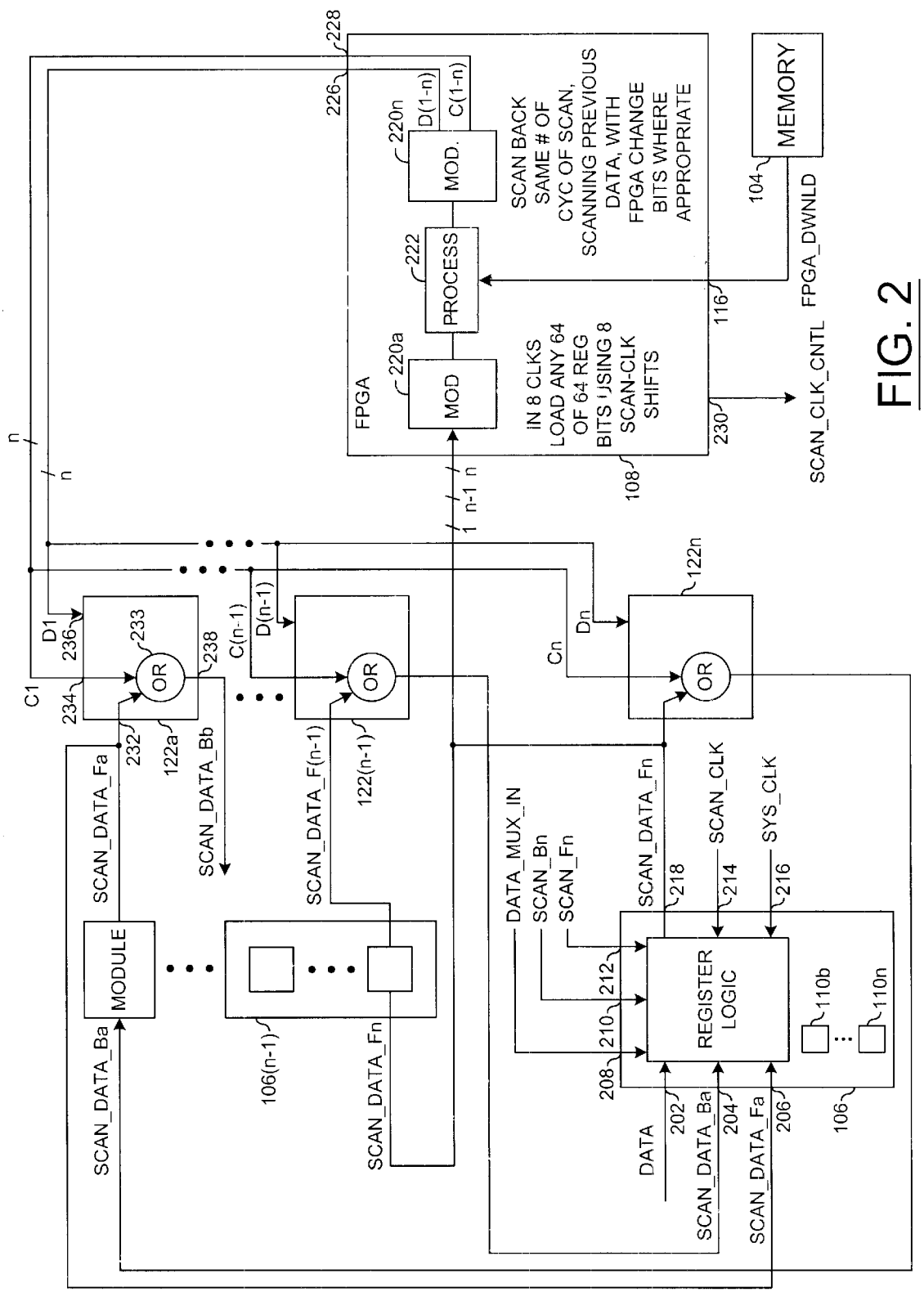
FIG. 2 is a block diagram of a preferred embodiment of the present invention.

Referring to FIG. 2, a block diagram of a circuit 100 is shown in accordance with a preferred embodiment of the present invention. The FPGA core interconnect 108 may enable bug fixes, in-field upgrades, or product variations using the original SOC 100. The FPGA core interconnect 108 may enable a wide range of SOC register access for FPGA inputs and FPGA outputs (e.g., for updating the registers). The present invention may also be implemented as a process for applying and using the proposed FPGA core interconnect architecture.

A typical FPGA core may be implemented as an embedded FPGA core that may be used to enable logic to be programmed after the silicon has been produced. Such an FPGA core may be used in areas of the SOC 100 that are likely to change. The FPGA core may also be used in areas of the SOC 100 that need different programming for known areas of product variation, bug fixes and/or in-field upgrades.

Preferably, the FPGA core 108 may be implemented with access to as many different registers 110a–110n of the SOC 100 as possible. The registers 110a–110n may be used as inputs to the FPGA core 108. The inputs may also be used for loading FPGA core output values. Such an implementation may improve the FPGA function contribution. For example, when using the FPGA to fix bugs or add future enhancements, attempting to (i) guess what registers are needed as inputs to the FPGA, (ii) guess what registers are likely to be needed to load with FPGA outputs and (iii) add the necessary logic to these chosen registers is not generally practical. The circuit 100 may avoid such guessing by allowing full access to all of the registers 110a–110n.

In certain applications, tester limitations for running a scan may be 25 MHz. Devices may be designed to handle speeds up to the system clock speed for a scan which, for certain applications, may be up to 400 MHz. However, in other applications, devices may typically only run at 27 MHz. With such slow speed devices (e.g., audio/video decoders) slower speed clocks may be desirable to reduce power consumption. Therefore, on a part that can run a scan at 400 MHz, a system clock may run at 27 MHz. With the present invention, the FPGA may take 12×27 MHz clocks to load inputs, process a function and load embedded registers with the output.

The circuit 100 illustrates a bi-directional scan technique. The bi-directional scan technique may implement the circuits 106a–106n, the circuit 108 and a plurality of logic circuits 122a–122n. The circuits 106a–106n may each comprise a plurality of registers 110a–110n. The circuit 106n may have (i) an input 202 that may receive a first data signal (e.g., DATA), (ii) an input 204 that may receive a second data signal (e.g., SCAN_DATA_Bn) and (iii) an input 206 that may receive a third data signal (e.g., SCAN_DATA_Fa). The circuit 106n may have (i) an input 208 that may receive a first input signal (e.g., DATA_MUX_IN), (ii) an input 210 that may receive a second input signal (e.g., SCAN_Bn) and (iii) an input 212 that may receive a third input signal (e.g., SCAN_Fn). The circuit 106n may have an input 214 that may receive a first clock signal (e.g., SCAN_CLK) and an input 216 that may receive a second clock signal (e.g., SYS_CLK). The circuit 106n may have an output 218 that may generate a signal (e.g., SCAN_DATA_Fn) in response to the signals DATA, SCAN_DATA_Bn, SCAN_DATA_Fa, DATA_MUX_IN, SCAN_Bn, SCAN_Fn, SCAN_CLK and SYS_CLK. The circuits 106a–106n may have similar implementation. The signals SCAN_DATA_Fa–SCAN_DATA_F(n–1) may be generated by the circuits 106a–106(n–1) similar to the way the signal SCAN_DATA_Fn is generated by the circuit 106n.

The circuit 108 generally comprises a plurality of registers 220a–220n and a process circuit 222. In one example, the registers 220a–220n may each be 64-bit registers. However, other types of registers may be implemented accordingly to meet the design criteria of a particular application. The circuit 108 may have an input 224 that may receive the signals SCAN_DATA_Fa–SCAN_DATA_Fn. In one example, the input 224 may be n-bits wide. The circuit 108 may have an output 226 that may generate a plurality of signals (e.g., D1–Dn). In one example, the output 226 may be n-bits wide. The signals D1–Dn may be generated in response to the signal FPGA_DWNLD and the signals SCAN_DATA_Fa–SCAN_DATA_Fn. The circuit 108 may have an output 228 that may generate a plurality of signals (e.g., C1–Cn). The output 228 may be, in one example, n-bits wide. The signals C1–Cn may be generated in response to the signal FPGA_DWNLD and the signals SCAN_DATA_Fa–SCAN_DATA_Fn. The circuit 108 may have an output 230 that may generate a control signal (e.g., SCAN_CLK_CNTL) in response to the signal FPGA_DWNLD.

The circuits 122a–122n generally each comprise a multiplexor 233. In one example, the multiplexor 233 may be implemented as a 2 to 1 multiplexor. However, other types of multiplexors may be implemented accordingly to meet the design criteria of a particular application. The circuit 122a may have an input 232 that may receive the signal SCAN_DATA_Fa, an input 234 that may receive the signal C1, and an input 236 that may receive the signal D1. The circuit 122a may have an output 238 that may generate the signal SCAN_DATA_Bb in response to the signals SCAN_DATA_Fa, C1 and D1. The circuits 122a–122n may have similar implementation. For example, the signals SCAN_DATA_Bc–SCAN_DATA_Bn may be generated by the circuits 122b–122n similar to the way the signal SCAN_DATA_Bb is generated by the circuit 122a.

In one example, 8 taps with 8 registers between the taps may be implemented. However, the particular number of taps and the particular number of registers may be varied accordingly to meet the design criteria of a particular implementation. An FPGA program may have an RTL model that may program the particular registers to capture out of the 64 registers that may be needed for the FPGA function.

A method for programming the FPGA core 108 may comprise one or more of the following steps (i) turning the signal SYS_CLK off, (ii) turning the signal SCAN_CLK on, (iii) forward shifting through a plurality of taps to a selected tap and/or (iv) serially loading the FPGA registers from the selected tap.

Scanning may be used to minimize the hardware needed to implement the FPGA interconnect. Adding (i) a backward scan shift function, (ii) a multiplexor to select the data feed from the FPGA, and (iii) internal FPGA functions for control of what particular registers to load from the scan in and what registers to load FPGA process data to on the scan out may enable such a hardware implementation. Using the scan approach, even other SOC chips may be scanned for useful FPGA core inputs, using spare SOC I/Os or using a scan link to the chip, with taps on the input.

Figure 3:
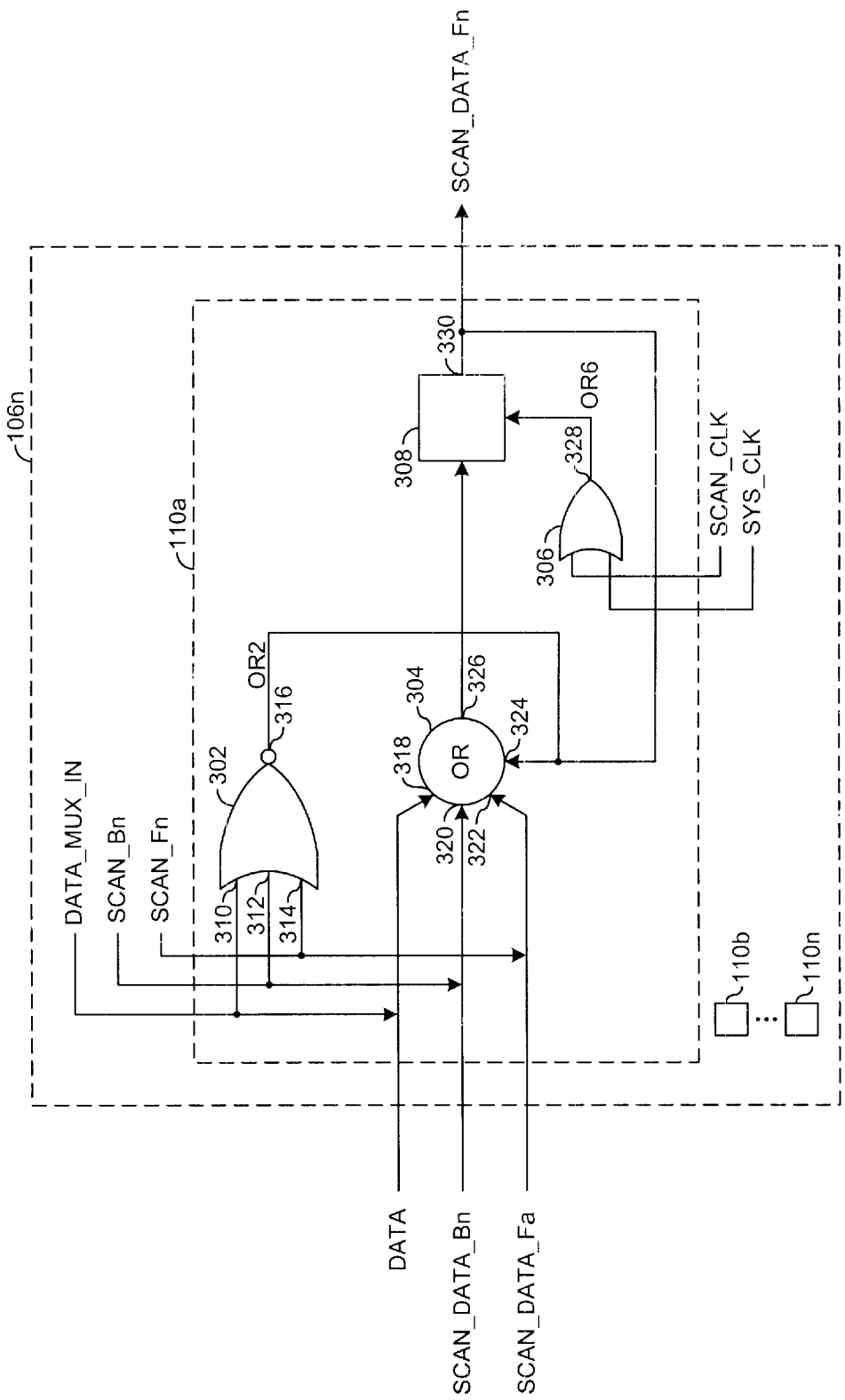
FIG. 3 is a detailed block diagram of a register logic block of FIG. 2.

Referring to FIG. 3, a more detailed block diagram of the circuit 110a is shown. The circuit 110a generally comprises a logic gate 302, a multiplexor 304, a logic gate 306 and a flip flop 308. In one example, the logic gate 302 may be a three input NOR gate and the logic gate 306 may be a two input OR gate. In one example, the multiplexor 304 may be a 4 to 1 multiplexor. In one example the flip flop 308 may be a D-type flip flop. However, other types of logic gates, multiplexors and/or flip flops may be implemented accordingly to meet the design criteria of a particular application.

The logic gate 302 may have an input 310 that may receive an input signal (e.g., DATA_MUX_IN), an input 312 that may receive an input signal (e.g., SCAN_Bn) and an input 314 that may receive an input signal (e.g., SCAN_Fn). The logic gate 302 may have an output 316 that may generate a signal (e.g., OR2) in response to the signals DATA_MUX_IN, SCAN_Bn, and SCAN_Fn.

The multiplexor 304 may have an input 318, an input 320, an input 322, an input 324 and an output 326. The input 318 may pass through the signal DATA to the output 326 when the signal DATA_MUX_IN is active. The input 320 may pass through the signal SCAN_DATA_Bn to the output 326 when the signal SCAN_Bn is active. The input 322 may pass through the signal SCAN_DATA_Fa to the output 326 when the signal SCAN_Fn is active. The input 324 may receive the signal OR2 from the output 316. The multiplexor 304 may have an output 326 that may generate a signal (e.g., MUX4) in response to one or more of (i) the signal DATA, (ii) the signal SCAN_DATA_Bn, (iii) the signal SCAN_DATA_Fa and/or (iv) the signal presented at the output 330.

The logic gate 306 may have an output 328 that may generate a signal (e.g., OR6) in response to the signals SCAN_CLK and SYS_CLK. The flip flop 308 may have an output 330 that may generate the signal SCAN_DATA_Fn in response to the signals MUX4 and OR6. The circuits 110a–110n have a similar implementation. For example, output signals may be generated by the circuits 110b–110n similar to the way the signal SCAN_DATA_Fn is generated by the circuit 110a.

Figure 4:
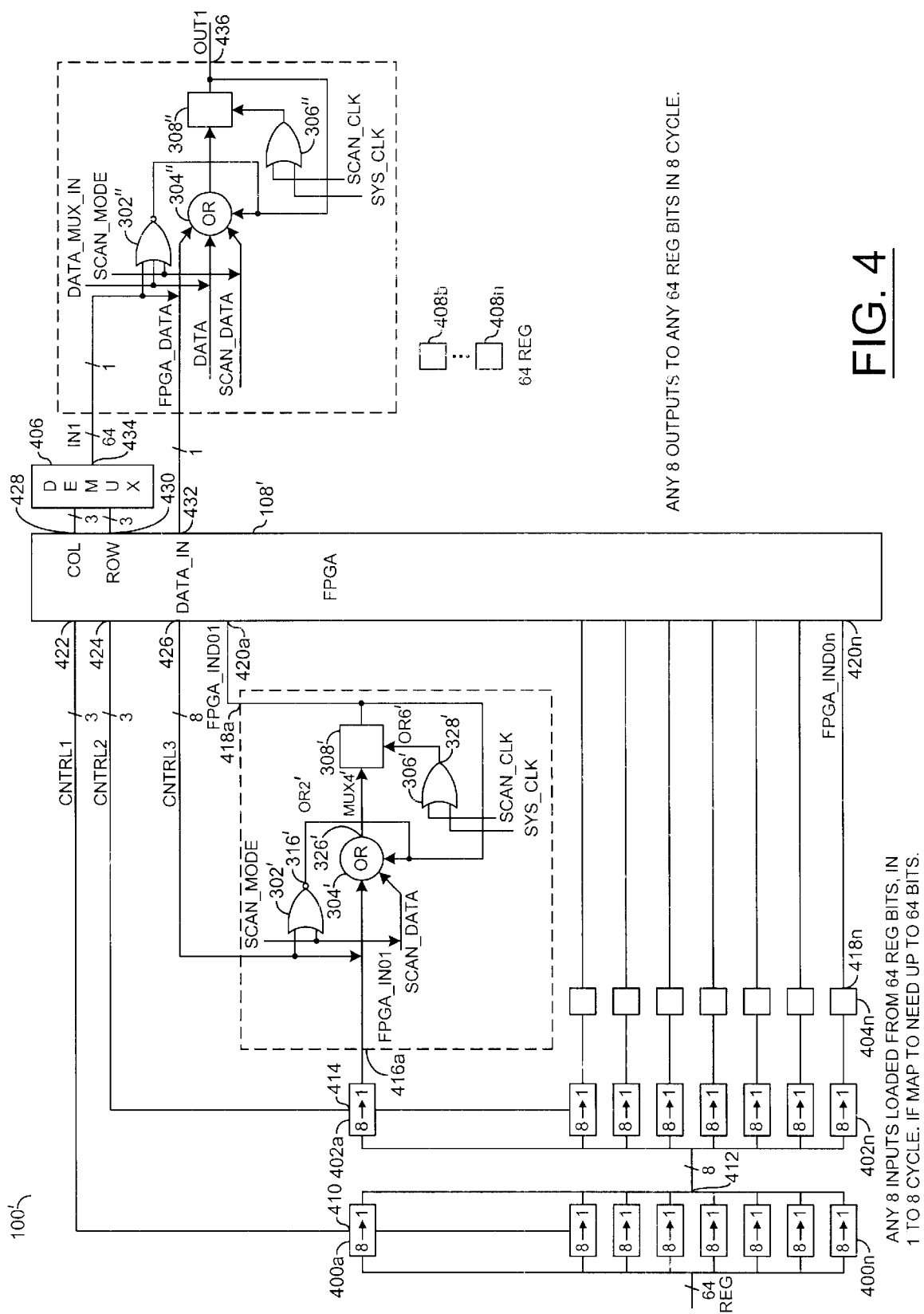
FIG. 4 is a block diagram of an alternate embodiment of the present invention.

Referring to FIG. 4, a circuit 100' illustrating an alternate embodiment of the present invention is shown. The circuit 100' may implement a multiplexing technique. The circuit 100' generally comprises a circuit 108', a plurality of multiplexors 400a–400n, a plurality of multiplexors 402a–402n, a plurality of circuits 404a–404n, a circuit 406 and a plurality of circuits 408a–408n. In one example, the multiplexors 400a–400n may each be an eight to one multiplexor, and the multiplexors 402a–402n may each be an eight to one multiplexor, where n is n integer. In one example, n may be equal to 8. The multiplexors 400a–400n may receive an input 64-bits wide, where each multiplexor receives 8 inputs. The multiplexors 400a–400n may have an input 410 that may receive a signal (e.g., CNTRL1) which may be 3-bits wide to support the 8 to 1 multiplexors. The multiplexors 400a–400n may have an output 412 that may generate, in one example, a signal 8-bits wide in response to the input 64-bits wide and the signal CNTRL1.

The multiplexors 402a–402n may each receive eight inputs. The multiplexors 402a–402n may have an input 414 that may receive a signal (e.g., CNTRL2) which may be 3-bits wide signal. The multiplexors 402a–402n may have a plurality of outputs 416a–416n that may generate a plurality of signals (e.g., FPGA_IN0–FPGA_INn–1). The signals FPGA_IN0–FPGA_IN(n–1) may be generated in response to the eight inputs presented to each of the multiplexors 402a–402n. Instead of using a scan, the multiplexors 400a–400n may be used to load any 8 inputs from 64 register bits, in 1 to 8 cycles of the signal SCAN_CLK. If mapped to the second level of multiplexors 402a–402n, any of the 64 bits may be the 8 inputs to the FPGA 108 '.

The circuit 404a generally comprises a logic gate 302', a multiplexor 304', a logic gate 306' and a flip flop 308 '. In one example, the logic gate 302' may be a two input NOR gate, the multiplexor 304' may be a 3 to 1 multiplexor and the logic gate 306' may be a two input OR gate. The flip flop 308' may, in one example, be a D-type flip flop. However, other types of logic gates, multiplexors and/or flip flops may be implemented accordingly to meet the design criteria of a particular application. The logic gate 302' may have an output 316' that may generate a signal OR2' in response to a control signal (e.g., CNTRL3) and a control signal (e.g., SCAN_MODE). The multiplexor 304' may have an output 326' that may generate the signal MUX4' in response to (i) the signal FPGA_IN01, (ii) a data signal (e.g., SCAN_DATA) and (iii) the signal OR2'. The logic gate 306' may have an output 328' that may generate a signal OR6' in response to the signals SCAN_CLK and SYS_CLK. The flip flop 308' may have an output 418a that may generate the signal FPGA_IND01 in response to the signals MUX4' and OR6'. The circuits 404b–404n may be similar to the circuit 404a. Therefore, the output signals FPGA_IN02–FPGA_IN0n may be generated by the circuits 404b–404n similar to the way the signal FPGA_IN01 is generated by the circuit 404a.

The circuit 108' may have a plurality of inputs 420a–420n which may receive the signals FPGA_IND01–FPGA_IND0n. The circuit 108' may have an output 422 which may present the signal CNTRL1 and an output 424 which may present the signal CNTRL2. The circuit 108' may have an output 426 that may present the signal CNTRL3. The circuit 108' may have an output 428 that may generate a signal (e.g., COL), which may be 3 bits wide, in response to the signals CNTRL1, CNTRL2, CNTRL3 and FPGA_IND01–FPGA_IND0n. The circuit 108' may have an output 430 that may generate a signal (e.g., ROW), which may be 3 bits wide, in response to the signals CNTRL1, CNTRL2, CNTRL3 and FPGA_IND01–FPGA_IND0n. The circuit 108' may have an output 432 that may generate a signal (e.g., DATA_IN) in response to the signals FPGA_IND01–FPGA_IND0n. The outputs 428, 430 and 432 of the circuit 108' may be loaded into the registers using a row/col register assignment with a data in signal.

The circuit 406 may have an output 434 that may generate a signal (e.g., IN1), which may be 64 bits wide, in response to the signals COL and ROW. The circuits 408a–408n may implement components similar to the components of the circuits 106a–106n. The circuit 408a may have an output 436 that may generate a signal OUT1 in response to the signals IN1, DATA_MUX_IN, SCAN_MODE, FPGA_DATA, DATA, SCAN_DATA, SYS_CLK and SCAN_CLK. The circuits 408b–408n may be similar to the circuit 408a. For example, the output signals of the circuits 404b–404n may be generated similarly to the way the signal OUT1 is generated by the circuit 404a.

The multiplexors 400a–n and 402a–n may be used to minimize the hardware needed to implement the FPGA interconnect. Adding two levels of multiplexors, with control from the FPGA, may enable loading any register to any FPGA input. A row/col register assignment, with a plurality of registers and a multiplexor, may enable such an implementation.

Figure 5:
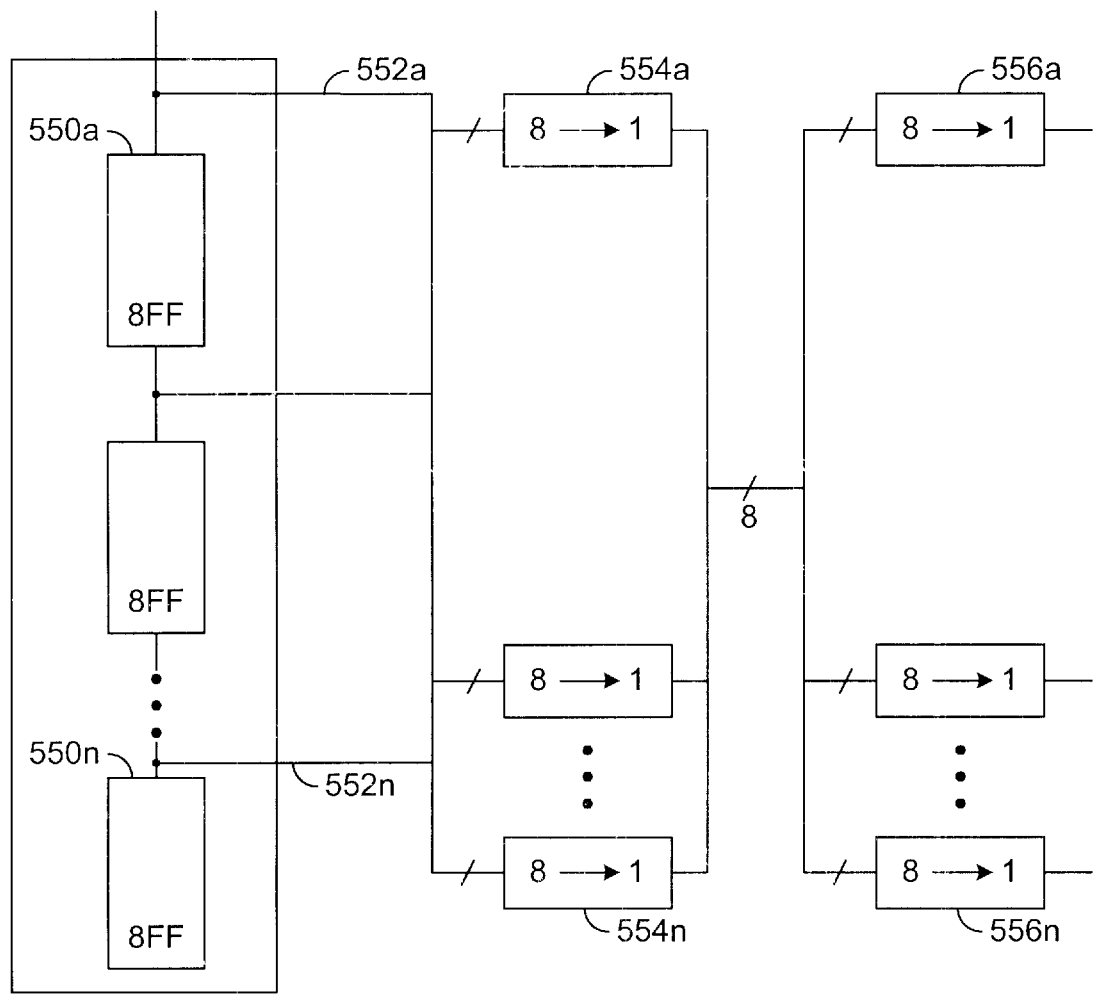
FIG. 5 is a block diagram of another alternate embodiment of the present invention.

Referring to FIG. 5, a circuit 100" is shown implementing another alternate embodiment of the present invention. The circuit 100" may implement a combination scanning/multiplexing technique. The circuit 100" may comprise a number of flip-flops 550a–550n, a number of taps 552a–552n, a number of multiplexors 554a–554n, a number of multiplexors 556a–556n. Each of the flip-flops 550a–550n may comprise, in one example, eight flip-flops. Each of the flip-flops 550a–550n may have one of tap 552a–552n. The first level of multiplexors 554a–554n and the second level of multiplexors 556a–556n may be implemented to minimize the interconnections of the circuit 100". In one example, both the first and second level of multiplexors may be 8 to 1 multiplexors. However, other types of multiplexors may be implemented accordingly to meet the design criteria of a particular application. Using the MUX approach to scan taps, up to 64 of the 512 bits may be accessible to the FPGA as inputs in eight cycles. Such an implementation provides a significant amount of inputs for a very low hardware cost (sixteen 8 to 1 multiplexors in the FIG. 4 example). The implementations illustrated in FIG. 2, FIG. 3 and FIG. 4 may permit use and template programming.

Design scales may be implemented to accommodate FPGA size, SOC size, and FPGA interconnect fragmentation needs. If part of the FPGA has access to chip I/O, part of the FPGA may use the scan approach and part of the FPGA may use the mux approach, with any combination of the approaches available.

The present invention may add value beyond integration of FPGA core versus off-chip FPGA chip by, for example, leveraging the integration benefit of more accessibility to internal signal points. For 27 MHz consumer products, the present invention may leverage the FPGA core 108 capability to run much faster, say 400 MHz, by using these faster cycles to serially load data in and out of the FPGA, saving interconnect signals. Implementing these two benefits together may enable any section of the chip to be accessible to the FPGA.

The present invention may enable accessibility by the FPGA core to embedded logic and registers elsewhere on the SOC. Such an implementation may add to the value of using the FPGA core to fix bugs after the SOC is in silicon. The time and cost of new revisions of silicon is saved. The usefulness of the embedded FPGA core may be expanded to permit access to most of the registers in the SOC for use in processing. Future enhancements and upgrades to the SOC can use methods of the present invention, providing earlier prototypes and longer life parts. Earlier prototypes, longer product life, customer specific upgrades, bug fixes in development and bug fixes in the field all translate to development cost savings and in product competitive sustainability.

While the invention has been particularly shown and described with reference to the preferred embodiments thereof, it will be understood by those skilled in the art that various changes in form and details may be made without departing from the spirit and scope of the invention.

What is claimed is:

1. A method for programming a field programmable gate array (FPGA) and implementing an FPGA interconnect to enable a wide range of system on a chip (SOC) register access for FPGA inputs and outputs to update one or more first registers comprising the steps of:
   (A) turning a system clock off;
   (B) turning a scan clock on;
   (C) forward shifting through a plurality of taps to a selected tap; and
   (D) serially programming said one or more first registers from the selected tap to establish an FPGA function.

2. The method according to claim 1, wherein said FPGA programming further comprises the step of implementing an RTL model to program which registers of the one or more first registers are needed for the FPGA function.

3. The method according to claim 1, further comprising the step of implementing a second plurality registers between each of said plurality of taps.

4. The method according to claim 1, further comprising the step of generating a model for programing which of said first plurality of registers to capture for implementing the FPGA function.

5. The method according to claim 1, further comprising the steps of:
   turning said scan clock off;
   executing an FPGA process; and
   generating outputs to be scanned into one or more of said first registers.

6. The method according to claim 5, further comprising the steps of:
   turning said scan clock on;
   backward shifting to a starting point with one or more new FPGA generated register values embedded where appropriate; and
   turning said system clock on.

7. The method according to claim 6, wherein one or more multiplexors are used to minimize the hardware necessary to implement said FPGA interconnect.

8. The method according to claim 7, wherein said method comprises a second level of multiplexors to enable loading any register to any said FPGA input.

9. The method according to claim 1, further comprising the step of loading any of one or more bits of said first registers in one or more cycles of said scan clock.

10. The method according to claim 1, further comprising the step of looping an end of a scan chain to an input of said FPGA.

11. The method according to claim 1, wherein any part of said FPGA that implements a chip I/O implements a scan approach, a multiplexor approach or any combination of said scan approach and said multiplexor approach.

12. The method according to claim 11, wherein said scan approach allows said FPGA to use inputs of other SOC chips.

13. An apparatus comprising:
   a plurality of register logic circuits each configured to generate a first logic signal in response to (i) an input data signal, (ii) a second logic signal, (iii) a first clock signal and (iv) a second clock signal;
   a core circuit configured to generate a plurality of data signals and a first control signal in response to (i) said first logic signal and (ii) a second control signal;
   a memory configured to present said second control signal to said core circuit and;
   a plurality of logic circuits each comprising a multiplexor, wherein each of said logic circuits is configured to generate said second logic signal in response to (i) said first logic signal and (ii) said plurality of data signals.

14. The apparatus according to claim 13, wherein said first clock signal comprises a system clock signal.

15. The apparatus according to claim 13, wherein said second clock signal comprises a scan clock signal.

16. The apparatus according to claim 13, wherein said first control signal comprises a scan clock control signal.

17. The apparatus according to claim 13, wherein said second control signal comprises a field programmable gate array (FPGA) program download signal.

18. The apparatus according to claim 13, wherein each of said plurality of register logic circuits further comprise:
   a flip flop;
   a NOR gate;
   a multiplexor; and
   an OR gate.

19. The apparatus according to claim 13, wherein said core circuit comprises a field programmable gate array (FPGA) core.

20. The apparatus according to claim 19, wherein said register logic circuits further comprises a plurality of registers.

21. The apparatus according to claim 20, wherein said plurality of register logic circuits and said FPGA core are connected by a plurality of taps.

22. The apparatus according to claim 20, further comprising a second plurality of multiplexors configured to connect any of said registers to any input of said FPGA core.

23. The apparatus according to claim 19, wherein said FPGA core and said logic circuits communicate bi-directionally.

24. The apparatus according to claim 19, wherein said apparatus is implemented in a product configured to operate at a first speed, wherein said FPGA core is configured to operate at a second speed.

25. The apparatus according to claim 24, wherein a plurality of portions of a chip are each accessible to said FPGA core.

26. A method for programming a field programmable gate array (FPGA) comprising the steps of:

downloading a FPGA program;

turning a system clock off;

turning a scan clock on;

scanning a plurality of registers; and programming said plurality of registers with an FPGA output having the FPGA program in response to said scan clock.

* * * * *